(12) United States Patent
Gerster et al.

(10) Patent No.: US 9,634,219 B2
(45) Date of Patent: Apr. 25, 2017

(54) METHOD FOR PRODUCING A THERMOELECTRIC OBJECT FOR A THERMOELECTRIC CONVERSION DEVICE

(71) Applicant: Vaccumschmelze GmbH & Co. KG, Hanau (DE)

(72) Inventors: Joachim Gerster, Alzenau (DE); Alberto Bracchi, Hanau (DE); Michael Muller, Woerth (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 529 days.

(21) Appl. No.: 14/254,675

(22) Filed: Apr. 16, 2014

(65) Prior Publication Data
US 2014/0314610 A1 Oct. 23, 2014

(30) Foreign Application Priority Data
Apr. 17, 2013 (DE) ........................ 10 2013 103 896

(51) Int. Cl.
| | | |
|---|---|---|
| B22F 3/02 | (2006.01) | |
| B22F 3/10 | (2006.01) | |
| B22F 5/00 | (2006.01) | |
| B22F 9/04 | (2006.01) | |
| C22C 13/00 | (2006.01) | |
| H01L 35/20 | (2006.01) | |
| H01L 35/34 | (2006.01) | |

(52) U.S. Cl.
CPC ............. *H01L 35/34* (2013.01); *B22F 5/003* (2013.01); *B22F 9/04* (2013.01); *C22C 13/00* (2013.01); *H01L 35/20* (2013.01); *B22F 2009/044* (2013.01); *B22F 2998/10* (2013.01); *B22F 2999/00* (2013.01)

(58) Field of Classification Search
CPC .... B22F 3/02; B22F 3/10; B22F 5/003; B22F 9/04; B22F 2009/044; B22F 2201/10; B22F 2201/11; B22F 2201/20; B22F 2998/10; B22F 2999/00; C22C 13/00; H01L 35/20; H01L 35/34
USPC ..................................................... 419/28, 22
See application file for complete search history.

(56) References Cited

U.S. PATENT DOCUMENTS

| | | | |
|---|---|---|---|
| 7,745,720 B2 | 6/2010 | Sakurada | |
| 7,851,692 B2 | 12/2010 | Sakurada | |
| 7,997,325 B2 | 8/2011 | Nakajima | |
| 8,067,686 B2 | 11/2011 | Shutoh | |
| 2004/0187905 A1* | 9/2004 | Heremans | H01L 35/34 136/238 |
| 2005/0139251 A1 | 6/2005 | Sakurada | |
| 2005/0172994 A1 | 8/2005 | Shutoh | |
| 2005/0217715 A1 | 10/2005 | Sakurada | |
| 2007/0125416 A1* | 6/2007 | Iwanade | H01L 35/20 136/236.1 |
| 2008/0173543 A1 | 7/2008 | Ziani | |
| 2010/0147352 A1 | 6/2010 | Matsubara | |
| 2011/0020164 A1* | 1/2011 | Stefan | H01L 35/34 419/45 |
| 2011/0048590 A1 | 3/2011 | Nakajima | |
| 2012/0326097 A1* | 12/2012 | Ren | H01L 35/18 419/33 |
| 2013/0026427 A1* | 1/2013 | Backhaus-Ricoult | H01L 35/22 252/519.12 |
| 2013/0240801 A1* | 9/2013 | Backhaus-Ricoult | H01L 35/22 252/519.12 |
| 2014/0225022 A1* | 8/2014 | Backhaus-Ricoult | H01L 35/22 252/62.3 T |
| 2016/0190421 A1* | 6/2016 | Mueller | B22F 3/10 419/33 |
| 2016/0254433 A1* | 9/2016 | Mueller | H01L 35/34 |

FOREIGN PATENT DOCUMENTS

| | | |
|---|---|---|
| DE | 102006057750 A1 | 8/2007 |
| WO | 2012087931 A2 | 6/2012 |

OTHER PUBLICATIONS

Sootsman, J.R., et al., "New and Old Concepts in Thermoelectric Materials", Angew. Chem. Int. Ed., 2009, No. 48, p. 8616-8639.
Yang, J., et al., "Evaluation of Half-Heusler Compounds as Thermoelectric Materials Based on the Calculated Electrical Transport Properties", Advanced Functional Materials, 2008, No. 18, p. 2880-2888.
Sakurada, S., et al., "Effect of Ti Substitution on the Thermoelectric Properties of (Zr,Hf)NiSn Half-Heusler Compounds", Applied Physics Letters, 2005, No. 86, p. 82105-1-82105-3.
Yan, Xiao, et al., "Enhanced Thermoelectric Figure of Merit of P-Type Half-Heuslers", NANO Letters, 2011, No. 11, p. 556-560.
Katayama, T., et al., "The Effects of Quaternary Additions on Thermoelectric Properties of TiNiSn-Based Half-Heusler Alloys", Journal of Electronic Materials, vol. 32, No. 11, 2003, p. 1160-1165.

* cited by examiner

*Primary Examiner* — Helene Klemanski
(74) *Attorney, Agent, or Firm* — Dickinson Wright PLLC

(57) ABSTRACT

A method for producing a thermoelectric object for a thermoelectric conversion device is provided. A starting material which contains elements in the ratio of a half-Heusler alloy is melted and then cast form an ingot. The ingot is heat-treated for 12 to 24 hours at a temperature of 1000° C. to 1200° C. The homogenised ingot is crushed and ground to provide a powder. The powder is cold-pressed and sintered for 0.5 to 24 hours at a temperature of 1000° C. to 1500° C.

24 Claims, 6 Drawing Sheets

METHOD FOR PRODUCING A THERMOELECTRIC OBJECT FOR A THERMOELECTRIC CONVERSION DEVICE

This application claims benefit of the filing date of DE 10 2013 103 896.4, filed 17 Apr. 2013, the entire contents of which is incorporated herein by reference.

BACKGROUND

1. Field

Disclosed herein is a method for producing a thermoelectric object for a thermoelectric conversion device, in particular a method for producing a thermoelectric object from a half-Heusler alloy.

2. Description of Related Art

Thermoelectric conversion devices use the Seebeck effect for obtaining electrical energy from heat which is typically wasted. A requisite for the wider use of the thermoelectric effect to convert heat into electric energy is the availability of efficient thermoelectric materials.

The efficiency of a thermoelectric material is described by its ZT value, which is defined by $ZT=TS^2\sigma/\kappa$: wherein T is the absolute temperature, S the Seebeck effect, $\sigma$ the electric conductivity and $\kappa$ the thermal conductivity. Half-Heusler alloys are considered to be a class of materials with a promising potential for high ZT values. U.S. Pat. No. 7,745,720 B2, for example, discloses half-Heusler alloys for thermoelectric conversion devices.

Half-Heusler alloys represent intermetallic compounds of the general formula XYZ with an ordered cubic C1$_b$ crystal structure. Each of the transition metals X, Y and a main group metal Z occupy one of three nested face-centred cubic (fcc) sublattices. A fourth fcc sublattice is unoccupied. If the sum of the valence electrons in this structure is 18, the compound exhibits a semi-conducting behaviour.

Half-Heusler alloys based on the systems XNiSn and XCoSb (X=Zr, Hf, Ti) are of interest for thermoelectric applications, because they have a high Seebeck effect and a high electrical conductivity. They have, however, relatively high thermal conductivity values as well, so that the ZT value of purely ternary compounds is limited.

In order to increase the ZT value of the half-Heusler alloys, their properties can be modified in a controlled manner by substitutions on all three sublattices. An example for this is the alloy TiNiSn, in which thermal conductivity can be reduced and electric conductivity can be increased by substituting the Ti location by Hf and Zr and the Sn location by Sb.

In order to provide thermoelectric objects for thermoelectric conversion devices which can be implemented in practice, suitable production methods are desirable.

SUMMARY

An object is therefore to provide a method for producing thermoelectric objects which allows thermoelectric objects to be produced on an industrial scale.

This problem is solved by the subject matter of the present disclosure.

An embodiment of the invention relates to a method for producing a thermoelectric object for a thermoelectric conversion device is provided, the method comprising the following. A starting material provided which contains elements in the ratio of a half-Heusler alloy described by the formula $\alpha\beta\chi$, wherein a is one or more of the elements of the group consisting of Ti, Zr and Hf, $\beta$ is Co or Ni and $\chi$ is Sn and/or Sb, the composition being described by $Zr_a Hf_b Ti_c NiSn_{1-d} Sb_d$ or $Zr_a Hf_b Ti_c CoSb_{1-e} Sn_e$, wherein $0 \leq a \leq 0.8$, $0 \leq b \leq 0.8$, $0 \leq c \leq 0.8$, $0 \leq d \leq 0.1$ and $0 \leq e \leq 0.3$ and the sum $(a+b+c)=1$.

The starting material is melted and then cast to form an ingot. The ingot is heat-treated for 12 to 24 hours at a temperature of 1000° C. to 1200° C. in order to produce a homogenised ingot. The homogenised ingot is crushed to form a powder, and the powder is ground. The powder is cold-pressed, forming a green body which is sintered for 0.5 to 24 hours at a temperature of 1000° C. to 1500° C., and whereby a thermoelectric object is produced.

The formula $\alpha\beta\chi$ identifies the ideal stoichiometry of 1:1:1. In practical applications, however, there may be deviations from this ideal stoichiometry, for example up to ±10%. These deviations are included in the formula $\alpha\beta\chi$ as defined herein.

The sum of the valence electrodes of a half-Heusler alloy having a high thermoelectric effect is theoretically 18. In practical applications, however, there may be deviations from this value, so that a range of 17.5 to 18.5 is specified here.

Another embodiment of the invention relates to a thermoelectric object in the form of a sintered ingot with a half-Heusler phase is produced by this method. The method is based on an industrial scale process and, using the powder metallurgical processes of grinding, cold-pressing and sintering, allows the production of objects of different shapes, so that objects of a suitable shape and size can be produced for various different thermoelectric conversion devices.

In this context, the term "sintering process" or "sintering" denotes a heat treatment resulting in a sintering of grains without using any high external pressure. For example, the heat treatment may be carried out under an external pressure of less than 10 bar. This excludes a hot pressing process, because this would involve the application of a high external pressure to the green body during the heat treatment.

A sintering method further allows the object to be produced with dimensions which approach its final contours, so that a practical working component for a thermoelectric conversion device can be realised with little, if any, further machining.

The starting material contains elements in ratios from which the composition of a half-Heusler alloy can be formed. The starting material may comprise pure elements or precursor alloys comprising two or more elements.

The ingot is heat-treated to produce a homogenised ingot. This heat treatment can enhance the purity of the half-Heusler alloy, so that further non-half-Heusler alloy phases can be reduced. This heat treatment of the ingot furthermore has an effect on the lower limit of the sintering temperature, which can be used to densely sinter the green body produced from the powder obtained from the ingot. In particular, the sintering temperature and the duration of the sintering process can be reduced, if the heat treatment is carried out at a temperature above 1000° C. A lower sintering temperature can reduce production costs, because the power consumption of the sintering process is reduced by the lower sintering temperature.

The starting material and the half-Heusler alloy of the thermoelectric object which is produced therefrom can have various compositions.

While this specification discloses specific half-Heusler alloys having the composition $Zr_a Hf_b Ti_c NiSn_{1-d} Sb_d$ or $Zr_a Hf_b Ti_c CoSb_{1-e} Sn_e$, wherein $0 \leq a \leq 0.8$, $0 \leq b \leq 0.8$, $0 \leq c \leq 0.8$, $0 \leq d \leq 0.1$ and $0 \leq e \leq 0.3$ and the sum $(a+b+c)=1$, the method can be used to produce half-Heusler alloys of other compositions.

Another embodiment of the invention relates to a further method for producing a thermoelectric object for a thermoelectric conversion device is made provided, the method comprising the following. A starting material is provided which contains elements in the ratio of a half-Heusler alloy described by the formula $\alpha\beta\chi$, wherein $a$ is one or more of the elements of the group consisting of Sc, Ti, V, Cr, Mn, Y, Zr, Nb, La, Hf, Ta and one or more of the rare earths, $\beta$ is one or more of the elements of the group consisting of Fe, Co, Ni, Cu and Zn, $\chi$ is one or more of the elements of the group consisting of Al, Ga, In, Si, Ge, Sn, Sb and Bi, and the sum of the valence electrons is 17.5 to 18.5. The starting material is melted and then cast to form an ingot. The ingot is heat-treated for 12 to 24 hours at a temperature of 1000° C. to 1200° C. in order to produce a homogenised ingot. The homogenised ingot is crushed, and the powder formed in this process is ground. The powder is cold-pressed, forming a green body which is sintered for 0.5 to 24 hours at a temperature of 1000° C. to 1500° C., and a thermoelectric object is produced.

In one embodiment, the half-Heusler alloy has a composition of $\alpha Ni_{1-y}\beta_y Sn_{1-z}\chi_z$, wherein $\alpha$ is one or more of the elements of the group consisting of Zr, Hf and Ti, $\beta$ is one or more of the elements of the group consisting of Fe, Co, Cu and Zn and $\chi$ is one or more of the elements of the group consisting of Al, Ga, In, Si, Ge, Sb and Bi, wherein $0 \leq y \leq 0.9$ and $0 \leq z \leq 0.3$.

In a further embodiment, the half-Heusler alloy has a composition of $\alpha Co_{1-y}\beta_y Sb_{1-z}\chi_z$, wherein $\alpha$ is one or more of the elements of the group consisting of Zr, Hf and Ti, $\beta$ is one or more of the elements of the group consisting of Fe, Co, Cu and Zn and $\chi$ is one or more of the elements of the group consisting of Al, Ga, In, Si, Ge, Sn and Bi, wherein $0 \leq y \leq 0.9$ and $0 \leq z \leq 0.3$.

In one embodiment, the half-Heusler alloy contains Ti and Zr and Hf. In another embodiment, the half-Heusler alloy is XNiSn, and a part of the Sn is replaced by Sb. By selecting the elements for X and replacing a proportion of Sn by Sb, the ZT value can be increased and the efficiency of the conversion of heat into electric energy can be improved.

The starting material can include elements in the ratio of 0.25 Zr:0.25 Hf:0.5 Ti:1 Ni: 0.998 Sn:0.002 Sb or 0.5 Zr:0.5 Hf:1 Co:0.8 Sb:0.2 Sn.

In one embodiment, the starting material has a weight of at least 5 kg. The ingot can be crushed into powder and ground in several steps. The ingot may for example be crushed by means of a jaw crusher. The crushed ingot can be ground in a mill to produce a coarse powder. After the grinding process to produce the coarse powder, a proportion of powder can form in a sieve of the mill. This proportion is ground in a further grinding process. These steps can be repeated as required, until the average particle size of the powder is reduced to a predetermined desired value. In such a process, the whole of the material can be made available in the form of a powder with the desired maximum particle size. The coarse powder can for example be produced by means of a disc mill.

In a further embodiment, the ingot is crushed to produce a coarse powder, which is then ground to a fine powder in a further grinding process. With this method, particle size can be reduced further. The fine powder is cold-pressed to form a green body. The fine powder can be produced by means of a planetary ball mill or a jet mill.

In one embodiment, after grinding, both the coarse powder and the fine powder are mixed. The mixture can be used to homogenise the fine powder or the composition of the fine powder respectively. The mixing process may involve rotation, translation and inversion.

The starting material can be melted in a vacuum induction melting process (VIM). A vacuum induction melting process allows large quantities of starting material to be melted in one melting operation and is therefore suitable for industrial-scale processes.

The pressure used in cold pressing can be optimised. In one embodiment, the fine powder is cold-pressed at a pressure of 1 $t/cm^2$ to 10 $t/cm^2$. An increased pressure can result in a reduction of sintering temperature, at which a high density, for example of at least 95% of theoretical density, can be obtained.

The ingot is homogenised for 12 to 24 hours at a temperature of at least 1000° C. in an inert gas atmosphere or in a vacuum. This heat treatment can be carried out in such a way that the proportion of the half-Heusler phase in the ingot is increased. The heat treatment conditions can be selected such that after the homogenisation treatment no reflexes of impurity or secondary phases can be seen in a $\theta$-$2\theta$ X-ray diffractogram.

In a further embodiment, the ingot is heat-treated for 12 to 24 hours at a temperature of 1050° C. to 1180° C. in order to homogenise the ingot.

The ingot and/or the green body can be heat-treated or sintered in an inert gas atmosphere or in a vacuum. The gas used may be argon, helium, hydrogen or forming gas. An inert gas or a vacuum prevents the oxidation of the ingot or green body.

The sintering behaviour of the half-Heusler alloy is influenced by the homogenisation heat treatment. In particular, the sintering temperature can be reduced compared to an ingot which has not been heat-treated or has been heat-treated at a temperature below 1000° C. or with a duration of less than 12 hours, while still obtaining a high density of at least 95%.

In addition, the sintering temperature can be adjusted as a function of the composition of the half-Heusler alloy. The sintering temperature is, for example, dependent on the titanium content. A suitable sintering temperature for a composition without titanium is approximately 1400° C., and for a composition with a high titanium content, a suitable sintering temperature is lower, for example approximately 1200° C.

The object produced using the above method can have a shape which is suitable for a working component of a thermoelectric conversion device. Alternatively, the object can be worked, e.g. machined, further in order to produce a working component. In one embodiment, the thermoelectric object is processed into a plurality of working components by means of sawing and/or grinding processes.

The sawing process may be carried out by wire sawing, centre hole sawing, wire spark erosion, water jet cutting and/or laser cutting. The grinding process may involve disc grinding, double disc grinding, abrasive band grinding and/or with the use of a flat grinding machine.

An economical production method for thermoelectric half-Heusler alloys, which can be implemented on an industrial scale and which includes melting by means of widely available VIM technology, the grinding of the ingot and the sintering of the powder by means of cold pressing and sintering, is therefore made available.

One advantage of the method described above is the fact that it can be used on an industrial scale and that it is economically viable. This advantage is achieved by using the conventional and widely available VIM technology, by having significantly shorter ageing times for the homogenisation treatment of the ingots and by using the easily scalable sintering method involving cold pressing and sintering.

To summarise, one embodiment provides a method for producing thermoelectric half-Heusler alloys which involves the following:

The alloying elements are first melted by means of a vacuum induction melting process, and the alloy is cast as an ingot.

The alloy is processed using various comminution and grinding methods (e.g. jaw crusher, disc mill, ball mill, jet mill), In several steps into a powder with an average value and median of the particle size distribution of less than 10 µm.

In order to obtain a homogenous distribution of the powder and to eliminate any fluctuations in the composition of various powder fractions, the powder can be homogenised by mixing using suitable methods, e.g. in a Turbula mixer, after the various grinding steps Using a pressing method, the powder is then compacted to form green bodies. Suitable pressing methods are tool pressing or isostatic pressing. The pressure lies between 1 t/cm² and 10 t/cm², achieving green densities of more than 50% of theoretical density.

In the subsequent sintering step, the green bodies are sintered at temperatures between 1000° C. and 1500° C. in an inert gas atmosphere (e.g. argon or vacuum), resulting in sintered bodies with a density of more than 95% of theoretical density. The precise sintering temperature for this process has to be adapted to the composition of the half-Heusler alloy.

In addition to the desired half-Heusler phase, VIM-melted half-Heusler alloys can typically contain a plurality of impurity or secondary phases. It was found that the alloy requires less time for homogenisation if higher ageing temperatures are used. Following one of the above process steps, the alloy can therefore be aged for homogenisation at temperatures between 1000° C. and 1200° C. for 12 to 24 hours, whereby the impurity or secondary phases are dissolved and the half-Heusler phase is maintained as predominant phase.

BRIEF DESCRIPTION OF DRAWINGS

Specific embodiments, examples and comparative examples will now be explained in greater detail with reference to the drawing.

DETAILED DESCRIPTION OF SPECIFIC EMBODIMENTS

A variety of methods for producing a thermoelectric object suitable for a thermoelectric conversion device will now be described. These methods include processes suitable for industrial scale production. In particular, a starting material is melted by means of vacuum induction melting (VIM) and then cast to produce an ingot. The ingot produced in this way is crushed and ground in several steps to produce a powder from the ingot. The powder is cold-pressed and sintered to produce sintered samples. These sintered samples can be used as thermoelectric components in thermoelectric conversion devices. In a further embodiment, the sintered sample are processed further in order to match their shape to the intended application. The samples are, for example, sawn to produce a plurality of working components from the sample.

The thermoelectric object is formed from a half-Heusler alloy. Described below are four embodiments and two comparative examples comprising a half-Heusler alloy of a (Zr, Hf, Ti)NiSn-type on and four embodiments comprising a half-Heusler alloy of a (Zr, Hf, Ti)CoSb-type.

Embodiment 1

An ingot of the half-Heusler alloy with the composition $Zr_{0.25}Hf_{0.25}Ti_{0.5}NiSn_{0.998}Sb_{0.002}$ is produced by means of vacuum induction melting. For charging the furnace, the elements are weighed in in accordance with their proportions in the alloy. The furnace is evacuated to a vacuum of 0.1 mbar or better and then heated up. Following the complete melting of the complete charge, an atmosphere of 800 mbar argon is set, and the melt is cast into a copper mould.

A part of the ingot produced in this way is pre-crushed by means of a jaw crusher and then processed in a disc mill into a coarse powder with a maximum particle size of 315 µm. The material to be ground passes through the disc mill in several steps. After each step, the fraction of the powder with a particle size of less than 315 µm is separated out by means of a sieve with a mesh width of 315 µm. The fraction which does not pass through the sieve passes through the disc mill with a reduced grinding gap in the next step, until the whole of the material is represented by a powder with a particle size of less than 315 µm. The powder is then mixed in a Turbula mixer for 30 minutes and homogenised in this process.

Figure 1:
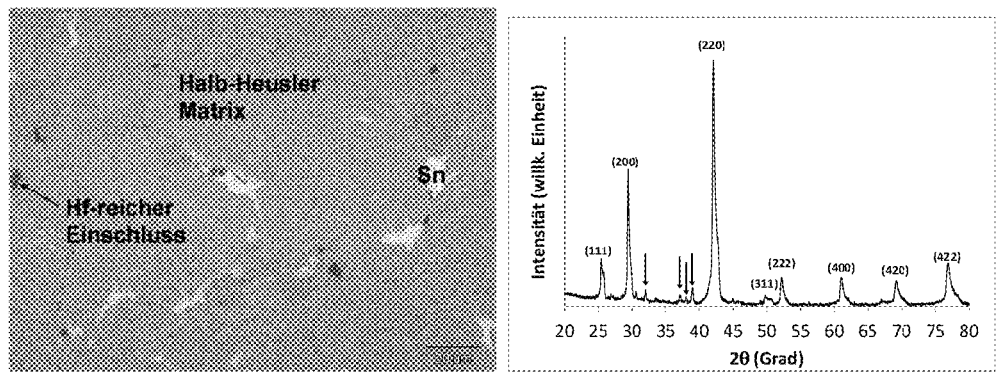
FIG. 1 is a light-micrograph and an X-ray diffractogram of an ingot from $Zr_{0.25}Hf_{0.25}Ti_{0.5}NiSn_{0.998}Sb_{0.002}$ according to a first embodiment.

To analyse the alloy in the as-cast state, light microscope micrographs of the cast structure and an X-ray diffractogram of the ground ingot after its passage through the disc mill were produced. These are shown in FIG. 1, which shows a light-microscopic picture of the structure and a corresponding X-ray diffractogram (Cu-Ka-radiation) of the ingot from the alloy $Zr_{0.25}Hf_{0.25}Ti_{0.5}NiSn_{0.998}Sb_{0.002}$ produced in Embodiment 1. In the X-ray diffractogram, the indices mark the reflexes of the half-Heusler phase. The arrows indicate reflexes associated with impurity or secondary phases.

As FIG. 1 shows, the as-cast structure contains several impurity or secondary phases in addition to the matrix of the half-Heusler phase. By way of example, FIG. 1 shows impurity or secondary phases consisting of Hf-rich inclusions (dark grey) and islands of non-dissolved Sn (white).

The existence of the impurity or secondary phases can also be seen in the X-ray diffractogram of FIG. 1. In the angle range between $30°<2\theta<40°$, the reflexes associated with impurity or secondary phases are marked by arrows. The remaining reflexes can be assigned to the half-Heusler phase in accordance with the indices specified in FIG. 1. All indicated reflexes have a shoulder towards higher diffraction angles. This shoulder may be due to a reflection split, because the half-Heusler alloy of the composition $Zr_{0.25}Hf_{0.25}Ti_{0.5}NiSn_{0.998}Sb_{0.002}$ is segregated into at least two half-Heusler phases of different lattice constants, as disclosed in U.S. Pat. No. 7,745,720. The resulting splitting of the reflexes can also be seen in the following diffractograms.

To produce the sintered samples, a part of the coarse powder with the particle size 315 μm is ground further in a planetary ball mill to produce a finer powder with a median particle size distribution of 2 μm. This powder was likewise mixed in a Turbula mixer for 30 minutes and homogenised. Following this, it was pressed under a pressure of 2.5 t/cm² to produce cylindrical green bodies with a diameter of approximately 9 mm.

The density of the green bodies produced in this way amounted to 62% of theoretical density. The green bodies were sintered in a furnace with argon as inert gas at temperatures between 1140° C. and 1220° C. The furnace was heated to sintering temperature at a rate of 10 K/min, and the dwell time at sintering temperature was 1 hour.

Figure 2:
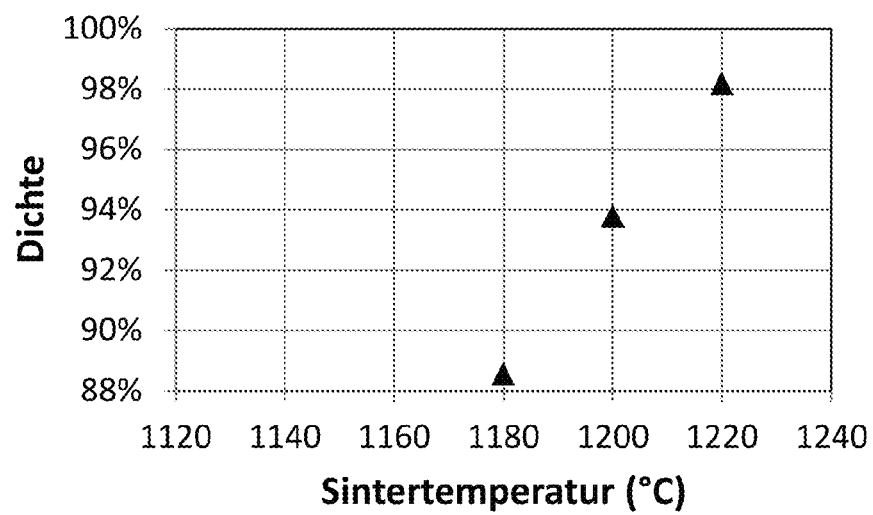
FIG. 2 is a graph of the density of sintered samples from the first embodiment as a function of sintering temperature.

FIG. 2 is a graph of the density of sintered samples from the ingot of the first embodiment as a function of sintering temperature. As FIG. 2 shows, the method described above can produce a dense sintered body with a density of more than 95% of the theoretical density of 8.23 g/cm² at a sintering temperature of 1220° C.

Embodiment 2

An ingot of the half-Heusler alloy with the composition $Zr_{0.25}Hf_{0.25}Ti_{0.5}NiSn_{0.998}Sb_{0.002}$ is produced by means of vacuum induction melting as described above for the first embodiment.

In the case of this second embodiment, the part of the ingot which is to be processed further is first heat treated for 24 hours at 1050° C. in an argon atmosphere for homogenisation. The homogenised ingot is then processed into powder as described above in the context of the first embodiment.

Figure 3:
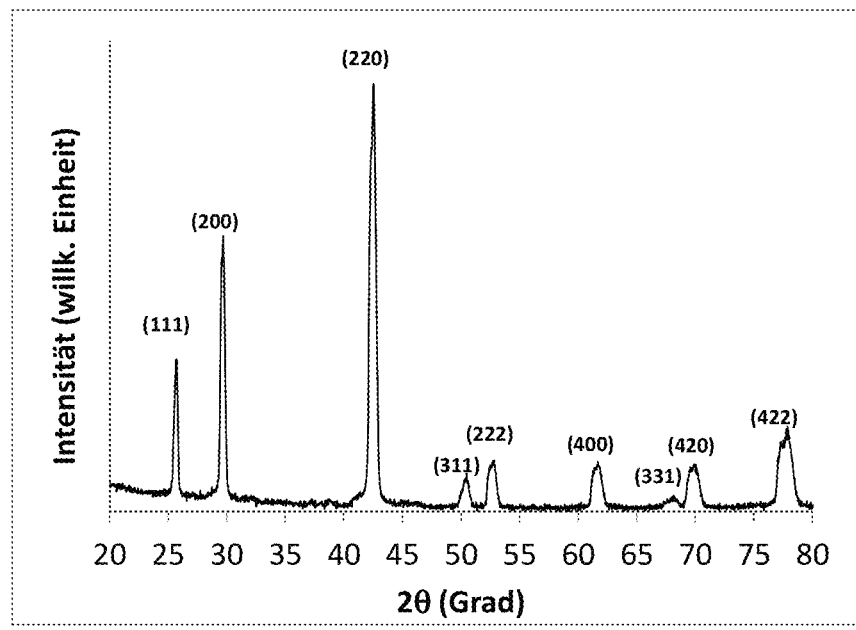
FIG. 3 is an X-ray diffractogram of a homogenised ingot from $Zr_{0.25}Hf_{0.25}Ti_{0.5}NiSn_{0.998}Sb_{0.002}$ according to a second embodiment.

To assess the effectiveness of the homogenising process or heat treatment, an X-ray diffractogram as shown in FIG. 3 is produced from the powder with a particle size of 315 μm as produced by the disc mill. The indices mark the reflexes of the half-Heusler phase.

FIG. 3 shows that, following the ageing process, no impurity or secondary phases can be detected by means of X-ray diffraction. Apart from the reflexes associated with the half- Heusler phase, no further reflexes are visible, in particular in the angle range between $30°<2\theta<40°$.

The powder produced from the homogenised ingot is pressed under a pressure of 2.5 t/cm³ into rectangular green bodies with dimensions of approximately (17.2×10.4×5) mm³. The green bodies have a density of 62% of theoretical density.

Samples are sintered at various temperatures and, afterwards, the density of the sintered samples is determined. The method described above in the context of the first embodiment is used for sintering at various temperatures. The results of the sintering processes are shown in FIG. 4, which is a graph of the density of the sintered samples as a function of sintering temperature.

Figure 4:
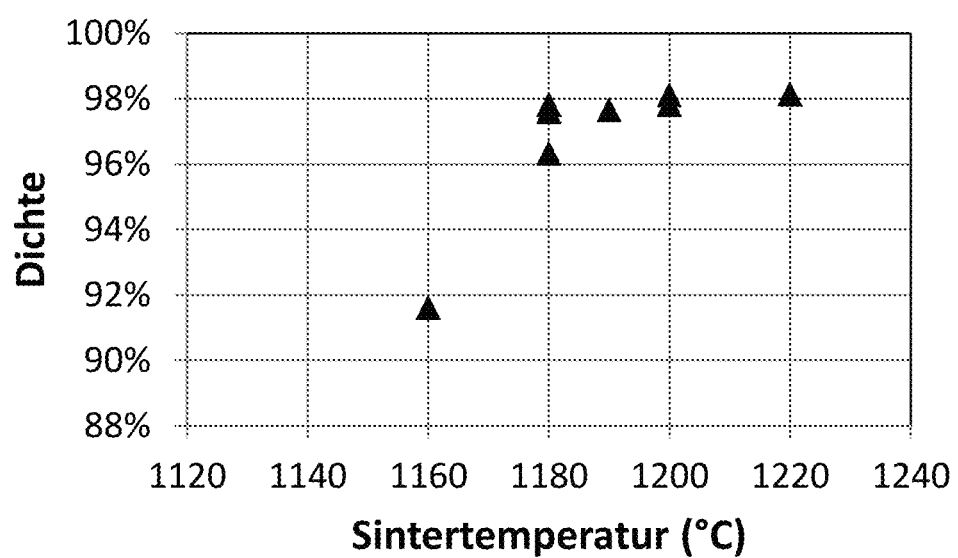
FIG. 4 is a graph of the density of sintered samples from the second embodiment as a function of sintering temperature.

FIG. 4 shows that the sintering temperature required for obtaining a density of more than 95% of theoretical density can be reduced by 40° C. to 1180° C. by homogenising the ingot before crushing and grinding into powder, when compared to the first embodiment, which is not heat-treated for homogenisation.

Figure 5:
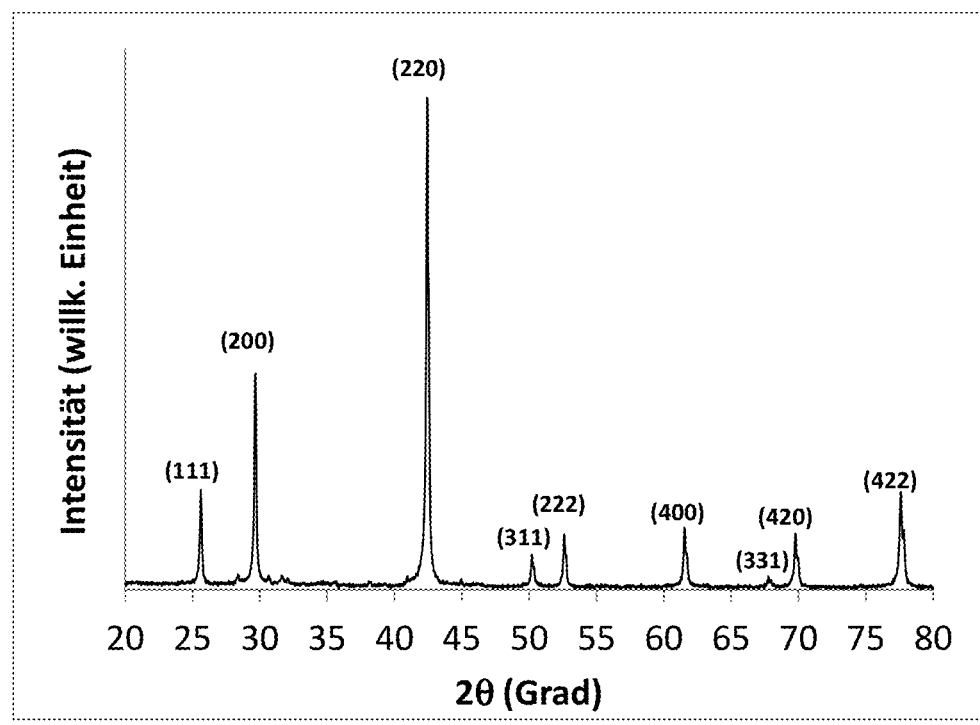
FIG. 5 is an X-ray diffractogram of a sample of the second embodiment sintered at 1190° C.

An X-ray diffractogram as shown in FIG. 5 is taken for a sample produced in accordance with the second embodiment and which is sintered at 1190° C. The X-ray diffractogram does not reveal any impurity or secondary phases in the sintered sample either; all of the reflexes to be seen can be attributed to the half-Heusler phase.

The method involving a heat treatment for homogenising the ingot before being processed into a powder is therefore capable of producing dense and phase-pure sintered bodies of the half-Heusler alloy made from the powder. Furthermore, the sintering temperature at which a density of at least 95% of theoretical density is achieved can be reduced. This can reduce manufacturing costs.

Comparative Example 1

An ingot of the half-Heusler alloy with the composition $Zr_{0.25}Hf_{0.25}Ti_{0.5}NiSn_{0.998}Sb_{0.002}$ is produced by means of vacuum induction melting as described above for Embodiments 1 and 2.

The part of the ingot which is to be processed further is subjected to a homogenisation treatment at a temperature below 1000° C., i.e. at 900° C., for 72 hours in an argon atmosphere.

Figure 6:
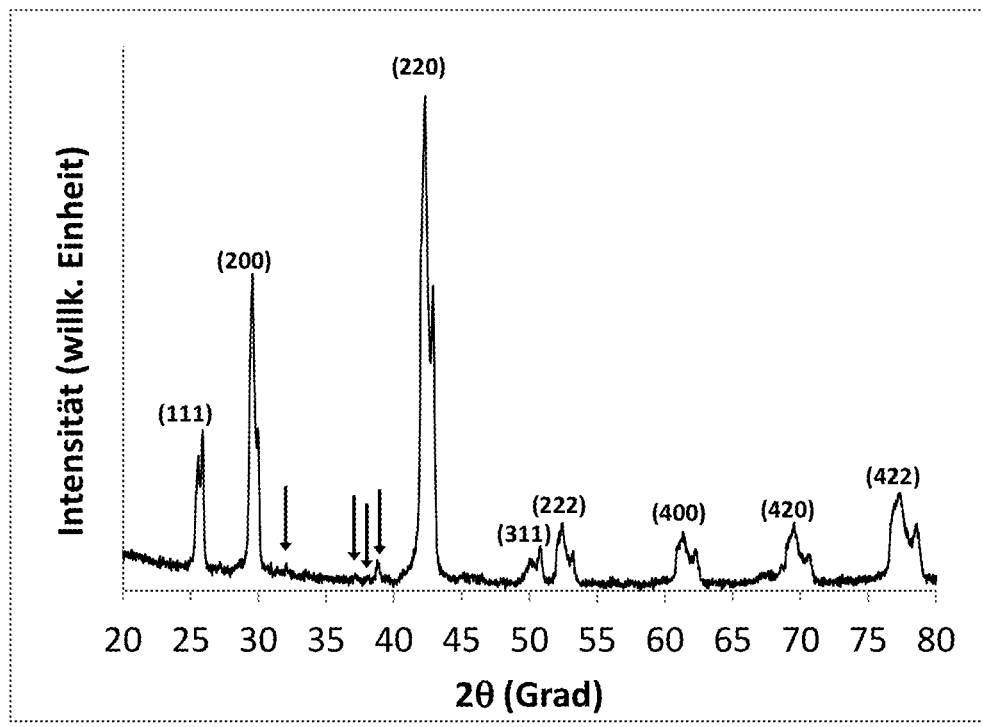
FIG. 6 is an X-ray diffractogram of a first comparative example.

The ingot heat treated in this way is processed into a powder with a particle size of 315 μm by means of a jaw crusher and a disc mill. The X-ray diffractogram shown in FIG. 6 is produced from this powder. Although the intensity of the impurity or secondary phase reflexes found in the as-cast state, which can be seen in FIG. 1, is reduced, the reflexes are nevertheless still clearly detectable. In contrast to a homogenising process at temperatures above 1000° C., heat treating at temperatures below 1000° C. does not result in a complete homogenisation of the half-Heusler alloy. Even at the longer ageing time of 72 hours, a complete homogenisation of the half-Heusler alloy is not achieved.

The coarse powder from the disc mill is, as in the first embodiment, processed further into a finer powder with a median particle size distribution of 2 μm and then pressed and sintered.

Samples are sintered at various temperatures and, afterwards, the density of the sintered samples is determined. The results of the sintering processes are shown in FIG. 7, which is a graph of the density of the sintered samples as a function of sintering temperature.

Figure 7:
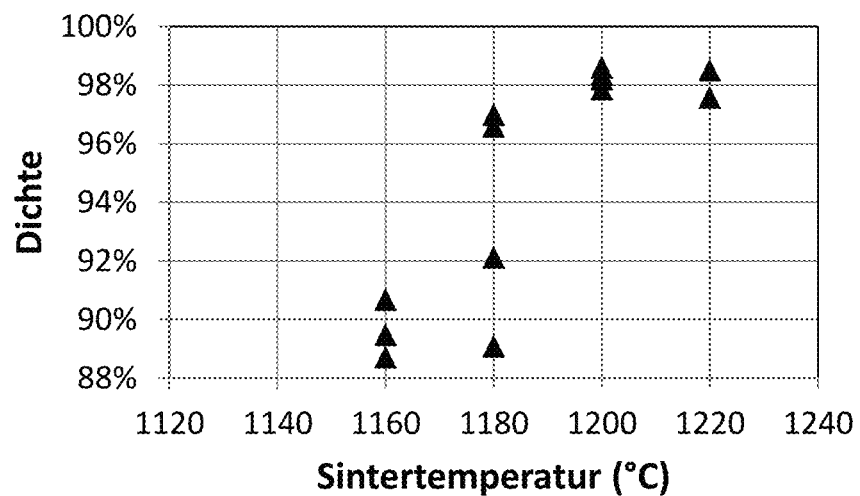
FIG. 7 is a graph of the density of sintered samples of the first comparative example.

As FIG. 7 shows, the homogenising process at 900° C. only allows the sintering temperature to be reduced by less than in the case of the second embodiment, regardless of the longer ageing period. Constantly dense samples with a density above 95% of theoretical density are only obtained at sintering temperatures from 1200° C. The density obtained at 1180° C., in contrast, varies strongly, being more than 95% in some samples and less than 90% in outliers. Compared to this, the sintering temperature can reliably be reduced to 1180° C. in the case of the second embodiment, as a result of the 24-hour ageing process at 1050° C.

Embodiment 3

An ingot of the half-Heusler alloy with the composition $Zr_{0.25}Hf_{0.25}Ti_{0.5}NiSn_{0.998}Sb_{0.002}$ was produced as described in the context of the second embodiment, homogenised and processed into a powder. The powder was pressed at an elevated pressure of 6.3 t/cm² to produce rectangular green bodies with dimensions of approximately (17.2×10.4×4) mm³.

Figure 8:
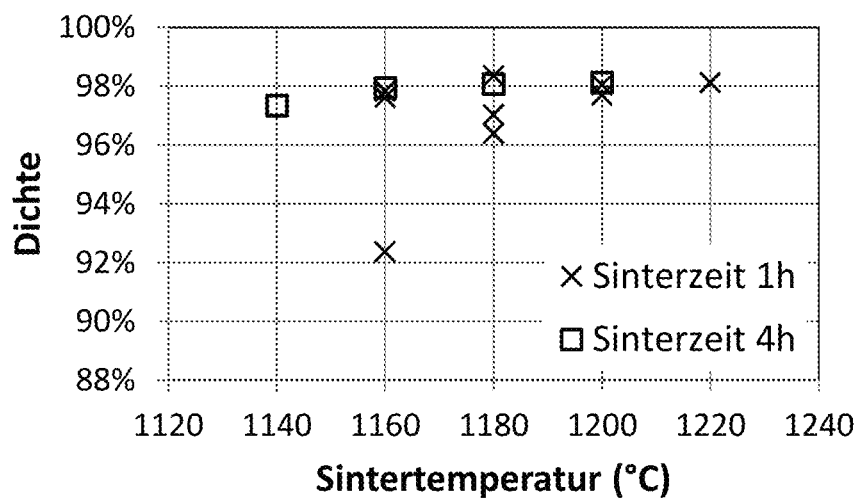
FIG. 8 is a graph of the density of sintered samples from $Zr_{0.25}Hf_{0.25}Ti_{0.5}NiSn_{0.998}Sb_{0.002}$ according to a third embodiment as a function of sintering temperature and sintering time.

The density of the green bodies produced in this way was 68% of theoretical density. The subsequent sintering process was carried out as described in the context of the first and second embodiments. The samples were sintered for 1 hour or 4 hours. The results of the sintering processes are shown in FIG. 8, which is a graph of the density of the sintered samples as a function of sintering temperature.

At a sintering time of 1 hour, the increased pressure did not lead to a better result compared to the second embodiment, see FIG. 4, i.e. a sintering temperature of 1180° C. is still required for producing samples with a density of 95% above the theoretical density of the material.

In contrast, at a sintering time of 4 hours, sintered bodies with a density of 95% above theoretical density were obtained at a temperature of 1140° C. The sintering temperature can therefore be reduced further by at least 40° C., compared to the first embodiment, which is not heat-treated for homogenisation and which is subjected to a lower pressure in the cold pressing process.

Comparative Example 2

Figure 9:
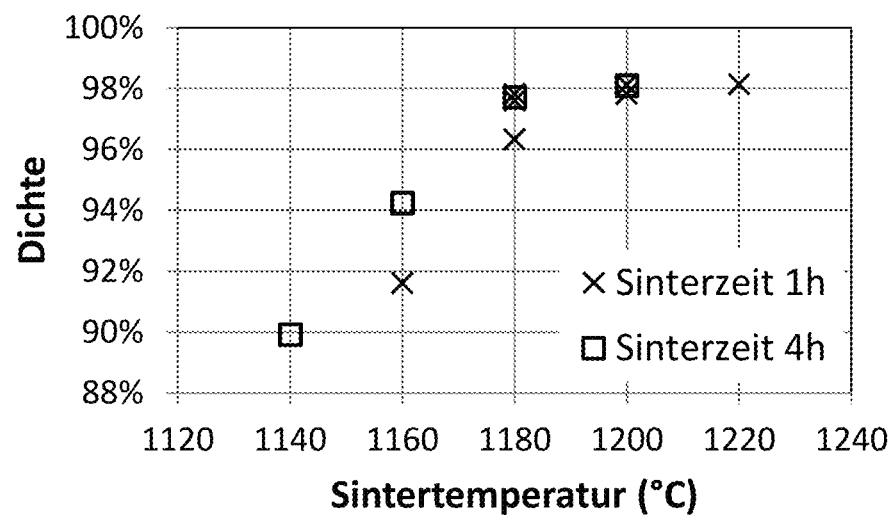
FIG. 9 is a graph of the density of sintered samples according to a second comparative example as a function of sintering temperature and sintering time.

Green bodies from the second embodiment, which are produced with a pressure of 2.5 t/cm² and have a green density of 62% of theoretical density, are, in addition to the sintering time of one hour used in the second embodiment, likewise sintered for four hours. The results of these tests are shown in FIG. 9. In contrast to the samples from the third embodiment, which are produced at an increased pressure, the longer sintering time did not result in a sufficiently dense sintered body at sintering temperatures below 1180° C. From the Comparative Example 2, it can be concluded that the increased pressure is responsible for this effect and that this effect can therefore not be attributed to the longer sintering time alone.

Embodiment 4

In a fourth embodiment, the material is sintered in a vacuum.

Figure 10:
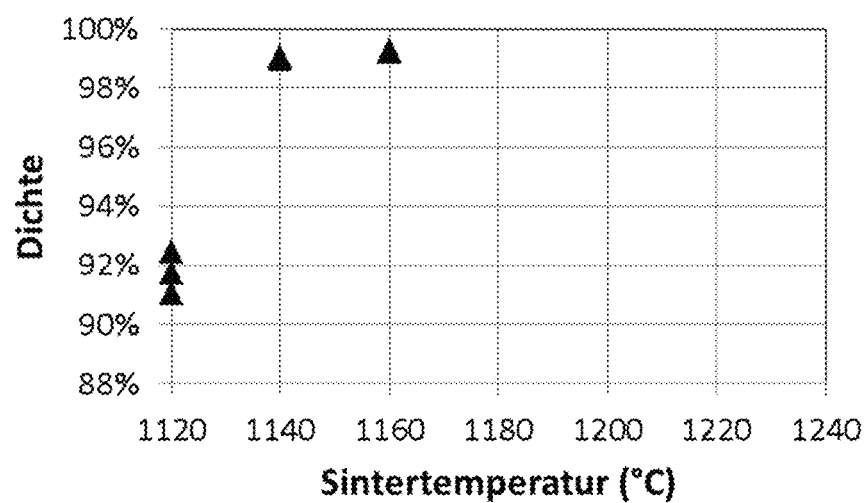
FIG. 10 is a graph of the density of sintered samples from $Zr_{0.25}Hf_{0.25}Ti_{0.5}NiSn_{0.998}Sb_{0.002}$ according to a third embodiment as a function of sintering temperature and sintering time.

An ingot of a half-Heusler alloy with the composition $Zr_{0.25}Hf_{0.25}Ti_{0.5}NiSn_{0.998}Sb_{0.002}$ is produced as described in the context of the second embodiment, homogenised, processed into a powder and pressed to form green bodies. The green bodies are sintered for one hour in a vacuum with a maximum pressure of $5\times10^{-2}$ mbar. The results of the sintering tests are shown in FIG. 10. They show that sintering in a vacuum can result in even higher densities than sintering in an argon atmosphere—cf. FIG. 4. Furthermore, these high density values can once again be obtained at a sintering temperature of 1140° C., i.e. a temperature which is reduced by up to 40° C.

XCoSb-based half-Heusler alloys are furthermore produced in processes which are suitable for industrial-scale production.

Embodiment 5

An ingot of a half-Heusler alloy with the composition $Zr_{0.5}Hf_{0.5}CoSb_{0.8}Sn_{0.2}$ is produced by means of vacuum induction melting as described in the context of the first embodiment and processed into a powder with a median particle size distribution of approximately 2 μm.

This powder is pressed in a tool press with a pressure of 2.5 t/cm² to produce rectangular green bodies with dimensions of approximately (17.2×10.4×5)mm³ and a green density of 62% of theoretical density.

The subsequent sintering process is carried out with argon as inert gas at temperatures of 1350° C. and 1400° C. for 30 minutes and 1 hour, at a ramp rate of 10 K/min. As the results in Table 1 show, a dense sintered body with a density of more than 95% of the theoretical density of 9.16 g/cm³ is obtained at a temperature of 1400° C.

TABLE 1

| Sample | Sintering Time | Sintering Temperature | Density |
| --- | --- | --- | --- |
| 1 | 30 min | 1400° C. | 95.4% |
| 2 | 30 min | 1400° C. | 95.0% |
| 3 | 30 min | 1400° C. | 95.2% |
| 4 | 1 h | 1350° C. | 93.9% |
| 5 | 1 h | 1400° C. | 95.8% |

Table 1 shows the density of the alloy $Zr_{0.5}Hf_{0.5}CoSb_{0.8}Sn_{0.2}$ produced in accordance with embodiment 4 after sintering at various temperatures and dwell times. The density is specified as a percentage of the theoretical density of 9.16 g/cm³.

Embodiment 6

In the sixth embodiment, the ingot of $Zr_{0.5}Hf_{0.5}CoSb_{0.8}Sn_{0.2}$ is subjected to a heat treatment for homogenisation. The half-Heusler alloy with the composition $Zr_{0.5}Hf_{0.5}CoSb_{0.8}Sn_{0.2}$ is produced as described in the context of the fifth embodiment. In accordance with the second embodiment, however, the ingot is aged in an argon atmosphere for 24 hours at 1100° C. for homogenisation before it is processed into powder.

Figure 11:
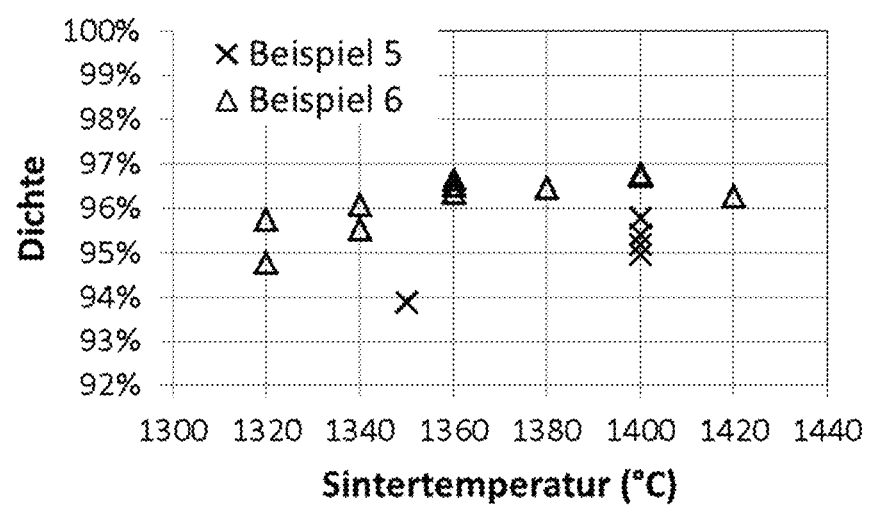
FIG. 11 is a graph of the density of sintered samples from $Zr_{0.5}Hf_{0.5}CoSb_{0.5}Sn_{0.2}$ according to a fourth and fifth embodiment as a function of sintering temperature and sintering time.

After the powder has been pressed into green bodies, the latter are sintered for 30 minutes in an argon atmosphere at various temperatures. The results of the sintering trials compared to the date from Embodiment 5 are shown in FIG. 11.

For the half-Heusler alloy with the composition $Zr_{0.5}Hf_{0.5}CoSb_{0.8}Sn_{0.2}$, the homogensing process carried out on the ingot likewise results in a significantly increased sintering ability. Even at temperatures of only 1340° C., sintered bodies with a density of more than 95% of theoretical density can be obtained as a result of the homogenising process, while without homogenising this result would require a temperature of 1400° C. Furthermore, significantly higher densities than in Embodiment 5 are obtained in the temperature range between 1360° C. and 1420° C.

TABLE 2

| Embodiment | Compound | Theoretical Density (g/cm³) | Sintering Time (min) | Sintering Temp. (° C.) | Obtained Density |
|---|---|---|---|---|---|
| 7 | $Ti_{0.5}Hf_{0.5}Co$—$Sb_{0.8}Sn_{0.2}$ | 8.9 | 30 | 1300 | 97.1% |
|   |   |   | 30 | 1320 | 98.2% |
|   |   |   | 30 | 1340 | 98.3% |
| 8 | $Ti_{0.5}Hf_{0.5}Co$—$Sb_{0.8}Sn_{0.2}$ | 7.7 | 30 | 1300 | 96.3% |
|   |   |   | 30 | 1320 | 97.8% |
|   |   |   | 30 | 1340 | 98.1% |

Embodiment 7

In the seventh embodiment, an ingot of a half-Heusler alloy with the composition $Ti_{0.5}Hf_{0.5}CoSb_{0.5}Sn_{0.2}$ is produced by means of vacuum induction melting, homogenised for 24 hours at 1100° C. for homogenisation, processed into a powder and pressed to form green bodies. The green bodies were then sintered for 0.5 hours at 1300° C., 1320° C. and 1340° C. The composition and the measured density of these samples are shown in Table 2. At each temperature, the method described produces sintered bodies with a density of more than 95% of theoretical density. This density increases with sintering temperature, so that the sample sintered at a temperature of 1340° C. has 98.2% of theoretical density.

Embodiment 8

In the eighth embodiment, an ingot of a half-Heusler alloy with the composition $Ti_{0.5}Hf_{0.5}CoSb_{0.8}Sn_{0.2}$ is produced by means of vacuum induction melting, homogenised for 24 hours at 1100° C. for homogenisation, processed into a powder and pressed to form green bodies. The green bodies were then sintered for 0.5 hours at 1300° C., 1320° C. and 1340° C. The composition and the measured density of these samples are shown in Table 2. At each temperature, the method described produces sintered bodies with a density of more than 95% of theoretical density. This density increases with sintering temperature, so that the sample sintered at a temperature of 1340° C. has 98.4% of theoretical density.

The production methods described herein are based on the use of industrial-scale methods, such as vacuum induction melting, cold pressing and sintering. With these methods, half-Heusler alloys can be produced on an industrial scale. If the ingot is subjected to a heat treatment at a temperature above 1100° C., the sintering temperature for the cold-pressed samples at which a high density is obtained can be reduced. The sintered objects produced in this way are suitable for use as thermoelectric objects in thermoelectric conversion devices, because, using the production methods described here, they can be produced cost-effectively in large quantities and in various shapes.

The invention claimed is:
1. A method for producing a thermoelectric object for a thermoelectric conversion device, comprising:
  providing a starting material which comprises elements in the ratio of a half-Heusler alloy described by the formula $\alpha\beta\chi$, wherein a is one or more of the elements of the group consisting of Ti, Zr and Hf, β is Co or Ni and $\chi$ is Sn or Sb or both, the composition being described by $Zr_aHf_bTi_cNiSn_{1-d}Sb_d$ or $Zr_aHf_bTi_c$, $CoSb_{1-e}Sn_e$, wherein 0≤a≤0.8, 0≤b≤0.8, 0≤c≤0.8, 0≤d≤0.1 and 0≤e≤0.3 and the sum (a+b+c)=1,
  melting the starting material, followed by casting an ingot,
  heat treating the ingot for 12 to 24 hours at a temperature of 1000° C. to 1200° C. in order to produce a homogenised ingot,
  crushing the homogenised ingot,
  grinding the crushed ingot, whereby a powder is produced,
  cold pressing the powder, whereby a green body is produced,
  sintering the green body 0.5 to 24 hours at a temperature of 1000° C. to 1500° C., and producing a thermoelectric object.

2. A method for producing a thermoelectric object for a thermoelectric conversion device, comprising:
  providing a starting material which comprises elements in the ratio of a half-Heusler alloy described by the formula $\alpha\beta\chi$, wherein a is one or more of the elements of the group consisting of Sc, Ti, V, Cr, Mn, Y, Zr, Nb, La, Hf, Ta and one or more of the rare earths, β is one or more of the elements of the group consisting of Fe, Co, Ni, Cu and Zn, $\chi$ is one or more of the elements of the group consisting of Al, Ga, In, Si, Ge, Sn, Sb and Bi, and the sum of the valence electrons is 17.5 to 18.5,
  melting the starting material, followed by casting an ingot,
  heat treating the ingot for 12 to 24 hours at a temperature of 1000° C. to 1200° C. in order to produce a homogenised ingot,
  crushing the homogenised ingot,
  grinding the crushed ingot, whereby a powder is produced,
  cold pressing the powder, whereby a green body is produced,
  sintering the green body 0.5 to 24 hours at a temperature of 1000° C. to 1500° C., and forming a thermoelectric object.

3. The method according to claim 2, wherein the half-Heusler alloy comprises a composition of $\alpha Ni_{1-y}\beta_ySn_{1-z}\chi_z$, wherein α is one or more of the elements of the group consisting of Zr, Hf and Ti, β is one or more of the elements of the group consisting of Fe, Co, Cu and Zn and $\chi$ is one or more of the elements of the group consisting of Al, Ga, In, Si, Ge, Sb and Bi, wherein 0≤y≤0.9 and 0≤z≤0.3.

4. The method according to claim 2, wherein the half-Heusler alloy comprises a composition of $\alpha Co_{1-y}\beta_ySb_{1-z}\chi_z$, wherein α is one or more of the elements of the group consisting of Zr, Hf and Ti, β is one or more of the elements of the group consisting of Fe, Co, Cu and Zn and $\chi$ is one or more of the elements of the group consisting of Al, Ga, In, Si, Ge, Sn and Bi, wherein 0≤y≤0.9 and 0≤z≤0.3.

5. The method according to claim 2, wherein the half-Heusler alloy has a composition based on XNiSn or XCoSb, X being one or more of the elements of the group consisting of Zr, Hf and Ti.

6. The method according to claim 5, wherein the half-Heusler alloy is XNiSn and a proportion of Sn is replaced by Sb.

7. The method according to claim 5, wherein the half-Heusler alloy comprises Ti and Zr and Hf.

8. The method according to claim 2, wherein elements with a ratio of 0.25 Zr:0.25 Hf:0.5 Ti:1 Ni:0.998 Sn:0.002 Sb or 0.5 Zr:0.5 Hf:1 Co:0.8 Sb:0.2 Sn are provided as starting material.

9. The method according to claim 2, wherein the starting material has a weight of at least 5 kg.

10. The method according to claim 2, wherein the homogenised ingot is crushed by means of a jaw breaker.

11. The method according to claim 2, wherein the homogenised ingot is crushed to a powder by means of a mill, wherein a proportion of powder forms in a sieve and this proportion of powder is ground in a further grinding process.

12. The method according to claim 2, wherein material is crushed by means of a disc mill.

13. The method according to claim 2, wherein the ingot is crushed to a coarse powder, the coarse powder is ground to a fine powder in a further grinding step and the fine powder is cold-pressed.

14. The method according to claim 13, wherein the further grinding is carried out by means of a planetary ball mill or a jet mill.

15. The method according to claim 2, wherein the powder is mixed after each passage through a mill.

16. The method according to claim 15, wherein the fine powder is mixed in an operation comprising rotation, translation and inversion.

17. The method according to claim 2, wherein the starting material is melted in a vacuum induction melting process.

18. The method according to claim 2, wherein the fine powder is cold-pressed with a pressure of 1 t/cm$^2$ to 10 t/cm$^2$.

19. The method according to claim 2, wherein the green body is sintered in an inert gas atmosphere or in a vacuum.

20. The method according to claim 2, wherein the ingot is heat-treated under argon or in a vacuum.

21. The method according to claim 2, wherein the ingot is heat-treated for 12 to 24 hours at a temperature of 1050° C. to 1180° C.

22. The method according to claim 2, further comprising processing the thermoelectric object into a plurality of working components by means of sawing or grinding processes or both.

23. The method according to claim 22, wherein the sawing process involves wire sawing, centre hole sawing, wire spark erosion, water jet cutting, or laser cutting, or both.

24. The method according to claim 22, wherein the grinding process involves disc grinding, double disc grinding, abrasive band grinding or the use of a flat grinding machine.

* * * * *